United States Patent
Prager et al.

(10) Patent No.: US 10,382,022 B2
(45) Date of Patent: Aug. 13, 2019

(54) HIGH VOLTAGE NANOSECOND PULSER WITH VARIABLE PULSE WIDTH AND PULSE REPETITION FREQUENCY

(71) Applicant: Eagle Harbor Technologies, Inc., Seattle, WA (US)

(72) Inventors: James R. Prager, Seattle, WA (US); Timothy M. Ziemba, Bainbridge Island, WA (US); Kenneth E. Miller, Seattle, WA (US); John G. Carscadden, Seattle, WA (US); Ilia Slobodov, Seattle, WA (US)

(73) Assignee: EAGLE HARBOR TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/921,650

(22) Filed: Mar. 15, 2018

(65) Prior Publication Data
US 2018/0205369 A1    Jul. 19, 2018

Related U.S. Application Data

(63) Continuation of application No. 14/798,154, filed on Jul. 13, 2015, now Pat. No. 10,020,800, which is a
(Continued)

(51) Int. Cl.
*H03K 3/00* (2006.01)
*H03K 3/57* (2006.01)
(Continued)

(52) U.S. Cl.
CPC ............. *H03K 3/57* (2013.01); *H03K 17/005* (2013.01); *H03K 17/56* (2013.01)

(58) Field of Classification Search
CPC ........................................................ H03K 3/57
(Continued)

(56) References Cited

U.S. PATENT DOCUMENTS

| 5,313,481 A | 5/1994 | Cook et al. |
| 6,359,542 B1 | 3/2002 | Widmayer et al. |

(Continued)

FOREIGN PATENT DOCUMENTS

| EP | 0174164 A2 | 3/1986 |
| EP | 1128557 A2 | 8/2001 |

OTHER PUBLICATIONS

A. Starikovskiy and N. Aleksandrov, "Plasma-assisted ignition and combustion," Progress in Energy and Combustion Science, 39, Feb. 1, 2013, pp. 61-110.
(Continued)

*Primary Examiner* — Metasebia T Retebo

(57) ABSTRACT

A nanosecond pulser is disclosed. In some embodiments, the nanosecond pulser may include one or more switch circuits including one or more solid state switches, a transformer, and an output. In some embodiments, the transformer may include a first transformer core, a first primary winding wound at least partially around a portion of the first transformer core, and a secondary winding wound at least partially around a portion of the first transformer core. In some embodiments, each of the one or more switch circuits are coupled with at least a portion of the first primary winding. In some embodiments, the output may be electrically coupled with the secondary winding and outputs electrical pulses having a peak voltage greater than about 1 kilovolt and a rise time of less than 150 nanoseconds or less than 50 nanoseconds.

21 Claims, 10 Drawing Sheets

Related U.S. Application Data continuation of application No. 14/542,487, filed on Nov. 14, 2014, now Pat. No. 9,960,763.

(60) Provisional application No. 62/023,708, filed on Jul. 11, 2014, provisional application No. 61/904,278, filed on Nov. 14, 2013.

(51) Int. Cl.
*H03K 17/00* (2006.01)
*H03K 17/56* (2006.01)

(58) Field of Classification Search
USPC .......................................................... 327/304
See application file for complete search history.

(56) References Cited

U.S. PATENT DOCUMENTS

| | | | |
|---|---|---|---|
| 6,496,047 | B1 | 12/2002 | Iskander et al. |
| 6,831,377 | B2 * | 12/2004 | Yampolsky ............. H01F 19/08 |
| | | | 307/106 |
| 7,901,930 | B2 | 3/2011 | Kuthi et al. |
| 8,093,979 | B2 | 1/2012 | Wilson |
| 8,115,343 | B2 | 2/2012 | Sanders et al. |
| 2010/0007358 | A1 | 1/2010 | Schaerrer et al. |
| 2014/0109886 | A1 | 4/2014 | Singleton et al. |
| 2014/0118414 | A1 | 5/2014 | Seo et al. |

OTHER PUBLICATIONS

Gaudet, J., et al, "Research Issues in Developing Compact Pulsed Power for High Peak Power Applications on Mobile Platforms," Proc. IEEE, Jun. 7, 2004, pp. 1144-1165.
D.A. Singleton et al., "Compact Pulsed-Power System for Transient Plasma Ignition," IEEE Trans. Plasma Sci., 37, Aug. 12, 2009 pp. 2275-2279.
Wang, F., "Compact High Repetition Rate Pseudospark Pulse Generator," IEEE Trans. Plasma Sci., 33, Aug. 4, 2005 pp. 1177-1181.
Singleton, D. R., "Low Energy Compact Power Modulators for Transient Plasma Ignition," IEEE Trans. Dielectr. Electr. Insul., 18, Aug. 4, 2011, pp. 1084-1090.
Rao, X., et al., "Combustion Dynamics of Plasma-Enhanced Premixed and Nonpremixed Flames," IEEE Trans. Plasma Sci., 38, Nov. 12, 2010 pp. 3265-3271.
Pokryvailo, A., et al, "A 1KW Pulsed Corona System for Pollution Control Applications." 14th IEEE International Pulsed Power Conference, Dallas, TX, USA, Jun. 15-18, 2003.
Pokryvailo, A., et al, "High-Power Pulsed Corona for Treatment of Pollutants in Heterogeneous Media," IEEE Trans. Plasma Sci., 34, Oct. 5, 2006, pp. 1731-1743.
Dammertz, G., et al, "Development of Multimegawatt Gyrotrons for Fusion Plasma Heating and Current Drive," IEEE Trans. Elec. Devices, 52, Apr. 5, 2005, pp. 808-817.
Zhu, Z., et al, "High Voltage pulser with a fast fall-time for plasma immersion ion implantation," Review Sci Inst, 82, 045102, Apr. 2011.
Sanders, J., et al, "Scalable, Compact, Nanosecond Pulse Generation with a High Repetition Rate for Biomedical Applications Requiring Intense Electric Fields," Pulsed Power Conference, 2009. PPC '09. IEEE, Washington, DC, Jun. 28, 2009-Jul. 2, 2009.
Schamiloglu, E., et al, "Scanning the Technology: Modern Pulsed Power: Charlie Martin and Beyond," Proc. IEEE 92, Jun. 7, 2004, pp. 1014-1020.
Garwin, Richard, "Pulsed Power Peer Review Committee Report," Sandia National Laboratories Report, SAND2000-2515, Oct. 2000.
International Search Report and Written Opinion dated Oct. 6, 2015 in related PCT Application No. PCT/US2015/040204 (15 pages).
International Search Report and Written Opinion dated Feb. 20, 2015 in related PCT application No. PCT/US2014/065832 (14 pages).
Partial Supplementary European Search Report dated Aug. 2, 2017 in related foreign application No. 14861818.4 (13 pages).
U.S. Office Action in U.S. Appl. No. 14/542,487, dated Feb. 12, 2016, 10 pgs.
U.S. Office Action in U.S. Appl. No. 14/542,487, dated Apr. 8, 2016, 11 pgs.
U.S. Office Action in U.S. Appl. No. 14/542,487, dated Dec. 12, 2016, 12 pgs.
U.S. Office Action in U.S. Appl. No. 14/542,487, dated Jun. 5, 2017, 11 pgs.
U.S. Office Action in U.S. Appl. No. 14/542,487, dated Nov. 23, 2015, 10 pgs.
U.S. Office Action in U.S. Appl. No. 14/542,487, dated Dec. 19, 2017, 7 pgs.
U.S. Office Action in U.S. Appl. No. 14/798,154, dated Jan. 5, 2016, 12 pgs.
U.S. Office Action in U.S. Appl. No. 14/798,154, dated Oct. 6, 2016, 13 pgs.
U.S. Office Action in U.S. Appl. No. 14/798,154, dated May 26, 2017, 15 pgs.
U.S. Office Action in U.S. Appl. No. 14/798,154, dated Dec. 28, 2017, 6 pgs.
U.S. Notice of Allowance in U.S. Appl. No. 14/542,487, dated Mar. 21, 2018, 5 pgs.
U.S. Notice of Allowance in U.S. Appl. No. 14/798,154, dated Jun. 1, 2018, 5 pgs.

\* cited by examiner

HIGH VOLTAGE NANOSECOND PULSER WITH VARIABLE PULSE WIDTH AND PULSE REPETITION FREQUENCY

SUMMARY

Various nanosecond pulsers are disclosed. In some embodiments, a nanosecond pulser may include one or more switch circuits including one or more solid state switches, a transformer, and an output. In some embodiments, the transformer may include a first transformer core, a first primary winding that is wound at least partially around a portion of the first transformer core, and a secondary winding wound at least partially around a portion of the first transformer core. In some embodiments, each of the one or more switch circuits are coupled with at least a portion of the first primary winding. In some embodiments, the output may be electrically coupled with the secondary winding and may output electrical pulses having a peak voltage greater than about 1 kilovolt and a rise time of less than 150 nanoseconds or less than 50 nanoseconds.

In some embodiments, the nanosecond pulser may include a pulse compression circuit disposed between the secondary winding and the output. The pulse compression circuit may include at least a saturable inductor arranged in series with the output of the secondary winding and a secondary capacitor arranged in parallel with the output of the secondary winding. The saturable inductor, for example, may be arranged in series with the output and the secondary capacitor is arranged in parallel with the output.

In some embodiments, the first primary winding may include a plurality of primary windings wound at least partially around a portion of the first transformer core, and wherein each of the plurality of switch circuits are coupled with a subset of the primary windings.

In some embodiments, the nanosecond pulser may include a second one or more switch circuit, a second transformer core and a second primary winding wound at least partially around a portion of the second transformer core. One or more of the second one or more switch circuits, for example, may be coupled with the second primary windings. The second primary winding, for example, may be wound at least partially around a portion of the second transformer core. In some embodiments, more than two cores may be used wherein the secondary winding wraps around each core and a set of primary windings coupled with switch circuitry around coupled with one of the cores.

In some embodiments, the first transformer core may include a toroid shape having a hole in the first transformer core. In some embodiments, the secondary winding may pass through the hole in the first transformer core and the first primary winding may pass through the hole in the first transformer core.

In some embodiments, the nanosecond pulser may include a circuit board having a top surface and a plurality of holes. In some embodiments, the first primary winding may terminate on the top surface of the first circuit board in two locations. In some embodiments, the second primary winding may pass through at least two of the plurality of holes for each winding.

A nanosecond pulser is disclosed that includes a first switch circuit; a first transformer core; a first primary winding electrically coupled with the first switch circuit and wrapped at least partially around the first transformer core; a second switch circuit; a second transformer core disposed adjacent to the first transformer core; a second primary winding electrically coupled with the second switch circuit and wrapped at least partially around the second transformer core; a secondary winding wrapped around the first transformer core and the second transformer core; and an output coupled with the secondary winding.

In some embodiments, the output may provide electrical pulses having a peak voltage greater than about 1 kilovolt and a rise time of less than 150 nanoseconds or less than 50 nanoseconds.

In some embodiments the nanosecond pulser may include a circuit board disposed between the first transformer core and the second transformer core.

In some embodiments, the first transformer core comprises a toroid shape with a hole and the second transformer core comprises a toroid shape with a hole. In some embodiments, the circuit board may include a hole that is aligned with the hole of the first transformer and the hole of the second transformer. In some embodiments, the secondary winding may pass through the hole in the first transformer core, the hole in the second transformer core, and the hole in the circuit board. In some embodiments, the secondary winding may pass through the hole in the first transformer core, the hole in the second transformer core, and a different hole in the circuit board for each winding of the secondary winding.

In some embodiments, the first transformer core may include a toroid shape having a hole and a perimeter and the first transformer core is disposed on a top surface of the circuit board. In some embodiments, the first primary winding comprises a first plurality of windings that are electrically coupled with the circuit board near the perimeter of the first transformer core and near the hole of the first transformer core.

In some embodiments, the second transformer core comprises a toroid shape having a hole and a perimeter, and the second transformer core is disposed on a bottom surface of the circuit board. In some embodiments, the second primary winding comprises a second plurality of windings that are electrically coupled with the circuit board near the perimeter of the second transformer core and near the hole of the second transformer core.

In some embodiments, the nanosecond pulser may include a first circuit board and a second circuit board. The first transformer core may include a toroid shape with a hole and may be disposed on the first circuit board. The second transformer core may include a toroid shape with a hole and may be disposed on the second circuit board. The first circuit board, for example, may include a hole that is aligned with the hole of the first transformer and the hole of the second transformer. The second circuit board may include, for example, a hole that is aligned with the hole of the first transformer and the hole of the second transformer. The secondary winding may, for example, pass through the hole in the first transformer core, the hole in the second transformer core, the hole in the first circuit board and the hole in the second circuit board.

In some embodiments, the nanosecond pulser may include a pulse compression circuit disposed between the secondary winding and the output.

In some embodiments, the secondary winding may include a single conductor wrapped multiple times around the first transformer core and the second transformer core.

A nanosecond pulser is disclosed that includes one or more switch circuits including one or more solid state switches; a fast capacitor disposed in series with the switch circuit; a transformer comprising a first transformer core, a first primary winding wound at least partially around a portion of the first transformer core, each of the one or more switch circuits are coupled with at least a portion of the first primary winding; and a secondary winding wound at least partially around a portion of the first transformer core; and an output electrically coupled with the secondary winding that outputs electrical pulses having a peak voltage greater than about 1 kilovolt and a rise time of less than about 150 nanoseconds or 50 nanoseconds.

In some embodiments, any stray inductance associated with the connection between the one or more switch circuits and the fast capacitor is less than 50 nH. In some embodiments, any stray inductance associated with the connection between the fast capacitor and the transformer is less than 50 nH. In some embodiments, any stray inductance associated with the connection between the transformer and the one or more switch circuits is less than 50 nH.

These illustrative embodiments are mentioned not to limit or define the disclosure, but to provide examples to aid understanding thereof. Additional embodiments are discussed in the Detailed Description, and further description is provided. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

A number of high voltage nanosecond pulsers are disclosed. In some embodiments, a nanosecond pulser may produce pulses with a voltage greater than 1 kilovolt and/or a rise time of less than 150 nanoseconds or less than 50 nanoseconds. In some embodiments, the high voltage nanosecond pulser may produce pulses with a programmable, controllable, and/or variable pulse width.

In some embodiments, the high voltage nanosecond pulser may include a plurality of switch circuits that may include one or more solid state switches coupled with a transformer. The transformer, for example, may include one or more transformer cores and a plurality of primary windings and one or more secondary windings. In some embodiments, the primary windings may be wrapped around a single transformer core and the secondary winding may be wrapped around more than one transformer core.

In some embodiments, the high voltage transformer may include a pulse compression circuit disposed between the transformer and the output that may decrease the rise time of a high voltage pulse.

Figure 1:
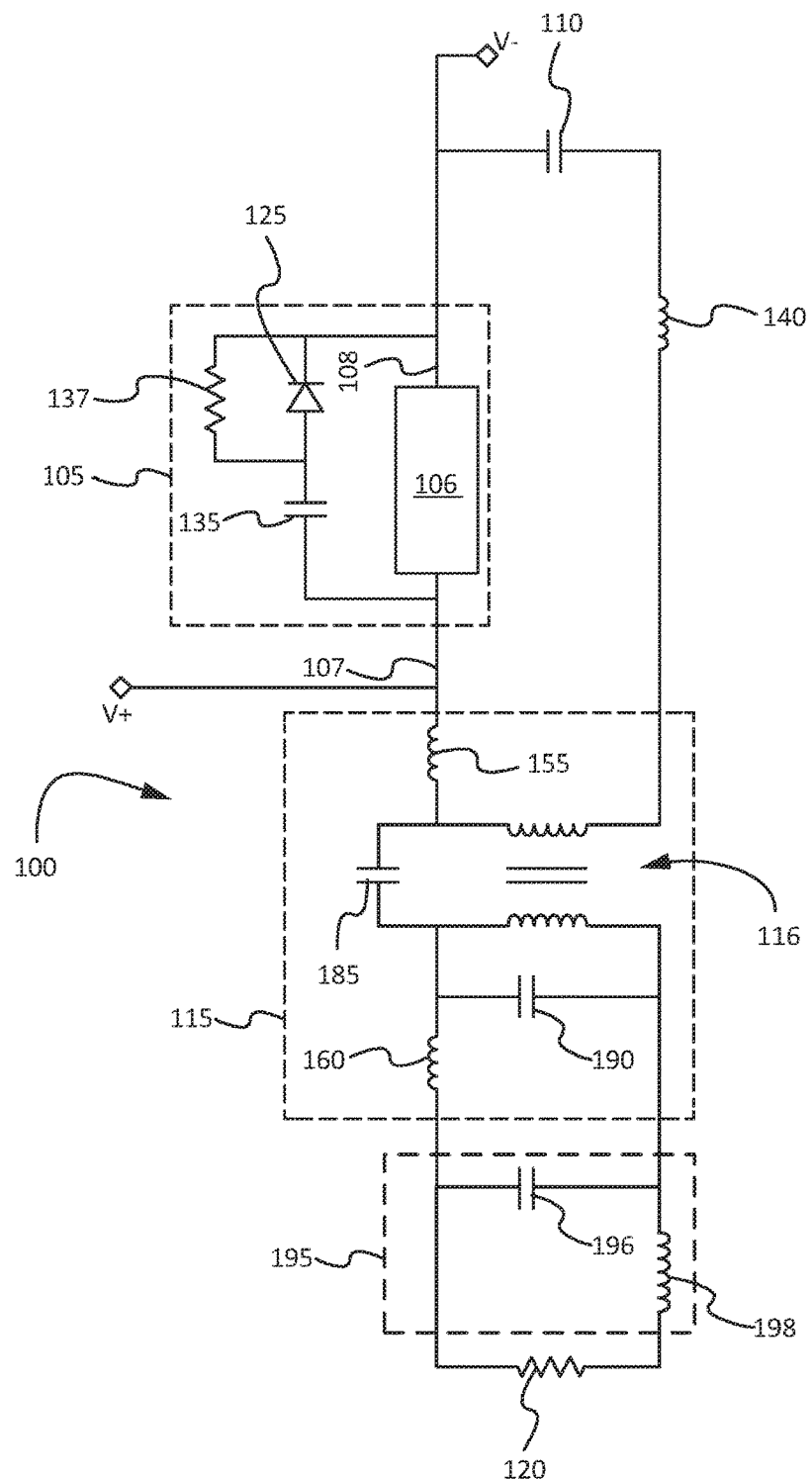
FIG. 1 illustrates an example circuit diagram of a nanosecond pulser according to some embodiments.

FIG. 1 illustrates an example circuit diagram of a nanosecond pulser 90 according to some embodiments. The nanosecond pulser 100 may include one or more switch circuits 105 that may include a switch 106, a snubber resistor 137, a snubber capacitor 135, a snubber diode 125, or some combination thereof. In some embodiments, the snubber capacitor 135 and the snubber diode 125 may be arranged in series with each other and together in parallel with the switch 106. The snubber resistor 137, for example, may be arranged in parallel with the snubber diode 125.

The switch 106 may include any solid state switching device that can switch high voltages such as, for example, a solid state switch, an IGBT, an FET, a MOSFET, an SiC junction transistor, or a similar device. The switch 106 may include a collector 107 and an emitter 108. Various other components may be included with the switch circuit 105 in conjunction with the switch 106. A plurality of switch circuits 105 in parallel, in series, or some combination thereof may be coupled with the transformer circuit 115.

The switch circuit 105 may be coupled with or may include a fast capacitor 110, which may be used for energy storage. In some embodiments, more than one switch circuit 105 may be coupled with a fast capacitor 110. In some embodiments, the fast capacitor may be an energy storage capacitor. The fast capacitor 110 may have a capacitance value of about 1 μF, about 5 μF, between about 1 μF and about 5 μF, between about 100 nF and about 1,000 nF etc.

During switching of the switch 106, the energy in the fast capacitor 110 may be discharged to the primary winding of the transformer 116. Moreover, in some embodiments, the energy within the fast capacitor 110 may not be substantially drained during each switch cycle, which may allow for a higher pulse repetition frequency. For example, in one switch cycle 5%-50% of the energy stored within the fast capacitor 110 may be drained. As another example, in one switch cycle 10%-40% of the energy stored within the fast capacitor 110 may be drained. As yet another example, in one switch cycle 15%-25% of the energy stored within the fast capacitor 110 may be drained.

The switch circuit 105 and the fast capacitor 110 may be coupled with a transformer circuit 115. The transformer circuit 115, for example, may include a transformer 116, capacitors, inductors, resistors, other devices, or some combination thereof. The transformer 116 may include a transformer core having a central hole with a plurality of primary windings and a plurality of secondary windings wound around the transformer core. In some embodiments, there may be more primary windings than secondary windings. In some embodiments, the transformer core may be toroid shaped; the perimeter may be square, polygonal, oval, rectangular, etc.

The transformer circuit 115 may include stray capacitance and/or stray inductance. Stray capacitor 185 represents the transformer primary to secondary stray capacitance. Stray capacitor 190 represents the transformer secondary stray capacitance. Inductor 155 represents the primary stray inductance of the transformer, and inductor 160 represents the secondary stray inductance of the transformer.

In some embodiments, the transformer 116 may include a toroid shaped transformer core comprised of air, iron, ferrite, soft ferrite, MnZn, NiZn, hard ferrite, powder, nickel-iron alloys, amorphous metal, glassy metal, or some combination thereof.

In some embodiments, the transformer primary to secondary stray capacitance and/or the transformer secondary stray capacitance may be below about 1 pF, below about 100 pF, about 10 pF, about 20 pF, etc. In some embodiments, the sum of the secondary stray capacitance and the primary stray capacitance may be less than about 50 pF, 75 pF, 100 pF, 125 pF, 135 pF, etc.

In some embodiments, the secondary stray inductance of the transformer and/or the primary stray inductance of the transformer may have an inductance value, for example, of 1 nH, 2 nH, 5 nH, 10 nH, 20 nH, between about 1 nH and 1,000 nH, less than about 100 nH, less than about 500 nH, etc.

In some embodiments, a nanosecond pulser may be designed with low stray capacitance. For example, the sum of all stray capacitance within the nanosecond pulser may be below 500 pF. This may include transformer circuit stray capacitance, switch circuit stray capacitance, other stray capacitance, or some combination thereof.

The primary windings of the transformer 116 can include a plurality of single windings. For example, each of the primary windings may include a single wire that wraps around at least a substantial portion of the toroid shaped transformer core and terminate on either side of the transformer core. As another example, one end of the primary windings may terminate at the collector 107 of the switch 106 and another end of the primary windings may terminate at the fast capacitor 110. Any number of primary windings in series or in parallel may be used depending on the application. For example, about 10, 20, 40, 50, 100, 116, 200, 250, 300, etc. or more windings may be used for the primary winding.

In some embodiments, a single primary winding may be coupled with a single switch circuit 105. In some embodiments, a plurality of switch circuits may be included and each of the plurality of switch circuits may be coupled with one of a plurality of primary windings. The plurality of windings may be arranged in parallel about the transformer core. In some embodiments, this arrangement may be used to reduce stray inductance in the nanosecond pulser 100.

Figure 9:
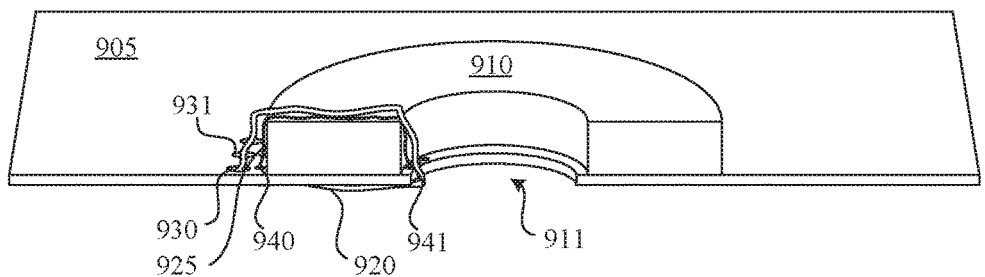
FIG. 9 illustrates a cutaway side view of a transformer with a single primary winding and a single secondary winding wrapped around a transformer core.

The secondary winding may include a single wire wrapped around the transformer core any number of times. For example, the secondary winding may include 5, 10, 20, 30, 40, 50, 100, etc. windings. In some embodiments, the secondary winding may wrap around the transformer core and through portions of the circuit board (e.g., as shown in FIG. 9). For example, the transformer core may be positioned on the circuit board with a plurality of slots in the circuit board arranged axially around the outside of the transformer core and an interior slot in the circuit board positioned in the center of the toroid shaped transformer core. The secondary winding may wrap around the toroid shaped transformer core and wrap through slots and the interior slot. The secondary winding may include high voltage wire.

In some embodiments, a pulse compression circuit 195 may be coupled with the transformer circuit 115. The pulse compression circuit 195, for example, may include a saturable inductor 198 and a secondary capacitor 196. The saturable inductor 198, for example, may have an inductance value of less than 100 nH, 10 µH, 100 µH, etc. prior to saturation and after saturation the inductance value may be less than 10 nH, 100 nH etc. The secondary capacitor 196, for example, may have a capacitance of less than about 10 pF, 100 pF, 1 nF, 100 nF, etc. The pulse compression circuit 195 may be coupled with the load 120. In some embodiments, a plurality of pulse compression modules may be coupled in series with the transformer module 115.

In some embodiments, the saturable inductor 198 may be arranged in parallel with the secondary winding of the transformer 116. In some embodiments, the secondary capacitor 196 may be arranged in parallel with the secondary winding of the transformer 116. In some embodiments, the saturable inductor 198 may be arranged in series with the load 120. In some embodiments, the secondary capacitor 196 may be arranged in parallel with the load 120. In some embodiments, the saturable inductor 198 may be arranged in parallel with the secondary capacitor 196.

In some embodiments, the pulse compression circuit 195 may reduce a rise time of a signal from the transformer circuit 115 to a signal with a lower rise time at the load 120. For example, the rise time of a signal at the load 120 may be less than 100 ns, 10 ns, 1 ns, etc. with a voltage greater than 1 kilovolt, 10 kilovolt, etc. and/or with a pulse repetition rate greater than 20 kHz, 50 kHz, 100 kHz, 500 kHz, 1 MHz, 10 MHz, etc. In some embodiments, the rise time produced by the transformer circuit 115 may be reduced by more than 2 times, 5 times, 10 times, 15 times, 20 times, etc.

In some embodiments, the nanosecond pulser 100 with the pulse compression circuit 195 may produce an output pulse with a pulse repetition frequency greater than 1 kHz, 10 kHz, 100 kHz, 1 MHz, 10 MHz, etc. This can be accomplished at least in part, for example, because the pulse compression circuit 195 is driven by the switching circuit 105 and transformer circuit 115 with a high pulse repetition frequency and a high power.

In some embodiments, the pulse compression circuit 195 may drive the load 120 with low impedance such as, for example, impedance below 1,000 Ohms, 500 Ohms, 250 Ohms, 100 Ohms, 50 Ohms, 10 Ohms, etc. In some embodiments, the pulse compression circuit 195 may drive the load 120 with a fast rise time without requiring multiple pulse compression circuits. In some embodiments, multiple pulse compression circuits may be included in series with the pulse compression circuit 195.

In some embodiments, a single pulse compression circuit 195 may be coupled with the transformer circuit 115 and the load 120.

In some embodiments, a plurality of pulse compression circuits may be coupled with the transformer circuit 115 and the load 120 in series and/or in parallel. Each pulse compression circuit 195 may include capacitors and/or inductors of different sizes.

In some embodiments, the value of the saturable inductor 198 and the value of the secondary capacitor 196 may be selected to allow the secondary capacitor 196 to be fully charged when the saturable inductor 198 becomes saturated. The transformer circuit 115 may charge the secondary capacitor 196 while it simultaneously saturates the saturable inductor 198. When the saturable inductor 198 becomes saturated the secondary capacitor 196 may be fully charged. Once the saturable inductor 198 saturates, the energy stored in the secondary capacitor 196 may be discharged through the saturable inductor 198 to the load 120. This may result in a fast rise time. In addition, energy from the transformer circuit 116 may continue to drive the pulse compression circuit 195 with enough energy (or voltage) to keep the saturable inductor 198 saturated and allowing the output pulse to have a pulse width as long as required.

Figure 2:
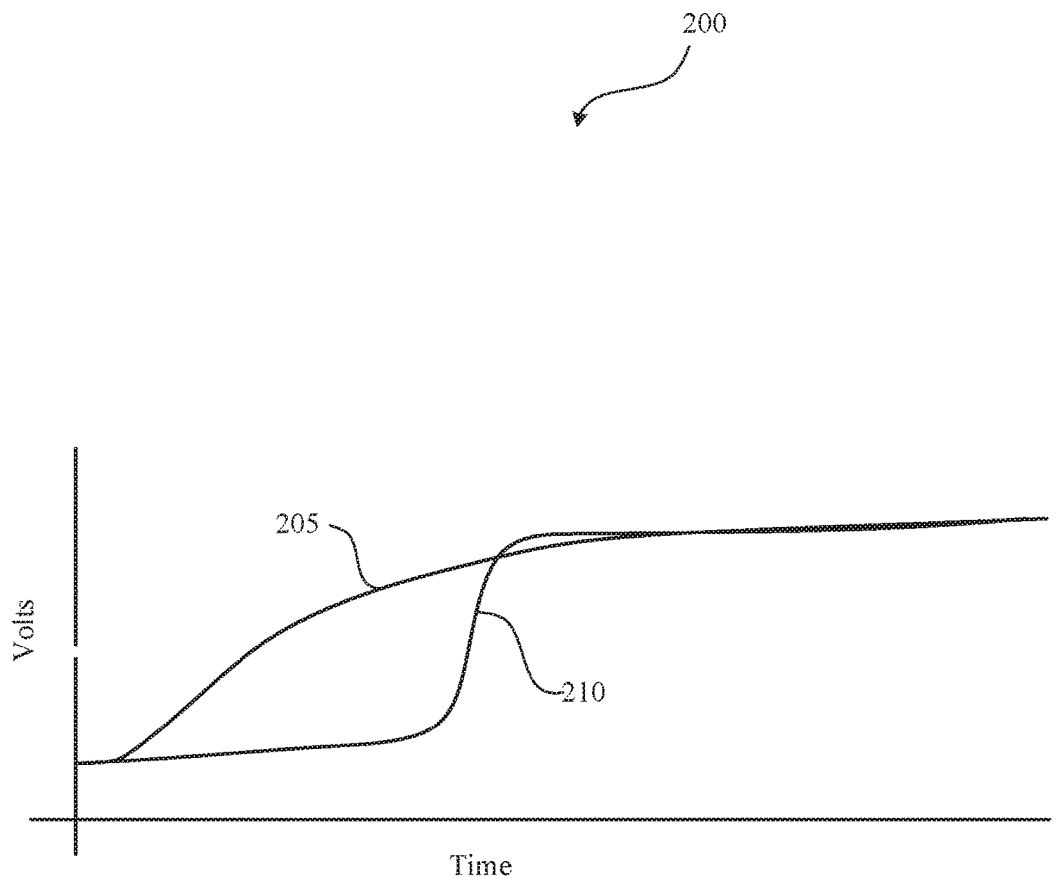
FIG. 2 is a graph of a pulse with and without the pulse compression circuit at the load according to some embodiments.

FIG. 2 is a graph 200 of a pulse 205 created without using the pulse compression circuit 195 and a pulse 210 at the load 120 using the pulse compression circuit 195 according to some embodiments. In this example, a 300 ohm load is included and/or the output voltage is 27 kVolts. The rise time of the pulse 205 prior to the pulse compression circuit 195 is 160 ns and is reduced to 20 ns after the pulse compression circuit 195.

Figure 3:
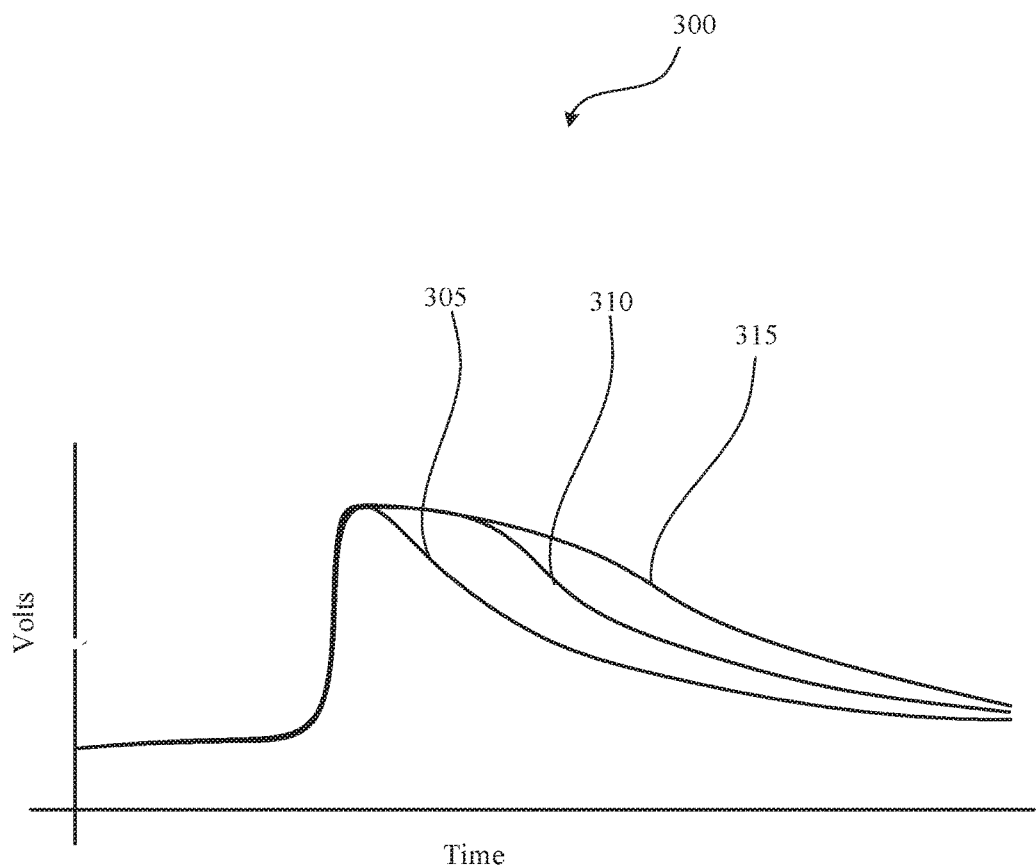
FIG. 3 is a graph showing three pulses across the load with different pulse widths according to some embodiments.

FIG. 3 is a graph 300 showing three pulses across the load 120 with different pulse widths according to some embodiments. For example, pulse 305 has a pulse width of 100 ns, pulse 310 has a pulse width of 200 ns, and pulse 315 has a pulse width of 300 ns. Each of the pulses, for example, has the same rise time of 2 ns. The pulse width of a pulse at the load 120 may depend at least in part on the pulse width of the pulse provided by the transformer circuit 115. Thus, the nanosecond pulse may produce pulses with variable pulse widths.

The primary windings of the transformer 116 shown in FIG. 1 can include a plurality of primary windings and one or more continuous secondary windings. For example, each of the primary windings may include a single electrical conductor (or wire) that wraps around at least a substantial portion of a toroid shaped transformer core and terminates on either or both sides of the transformer core. As another example, one end of the primary windings may terminate at the collector 107 of the switch 106 and another end of the primary windings may terminate at the fast capacitor 110. Any number of primary windings in series or in parallel may be used depending on the application. For example, about 10, 20, 40, 50, 100, 116, 200, 250, 300, 500, 750, 1,000 etc. or more windings may be used for the primary winding. In some embodiments, the primary windings may include a conductive sheet that is wrapped around the transformer core rather than a plurality of conductors wound around the transformer core to create, in addition to, or in the place of the plurality of primary windings. In some embodiments, copper (or any other conductive material) tape may be wrapped around a transformer core to create, in addition to, or in the place of the one or more primary windings. In some embodiments, a conductor may be sprayed on a transformer core (e.g., with an insulator in between) to create, in addition to, or in the place of the plurality of primary windings. In some embodiments, a conductor may be deposited on the transformer core (e.g., using vapor deposition techniques) to create, in addition to, or in the place of the plurality of primary windings.

In some embodiments, a single primary winding may be coupled with a single switch circuit 105 and/or a single fast capacitor 110. In some embodiments, a plurality of switch circuits 105 and/or a plurality of fast capacitors 110 may be included and each of the plurality of switch circuits may be coupled with one of a plurality of primary windings. The plurality of windings may be arranged in parallel about the transformer core. In some embodiments, this arrangement may be used to reduce stray inductance in the nanosecond pulser 100.

The one or more continuous secondary windings may include an electrical conductor (or wire) that wraps around the toroid shaped transformer core more than once. In some embodiments, the number of secondary windings may be fewer than the number of primary windings. In yet other embodiments, the number of secondary windings may be greater than the number of primary windings.

Figure 5:
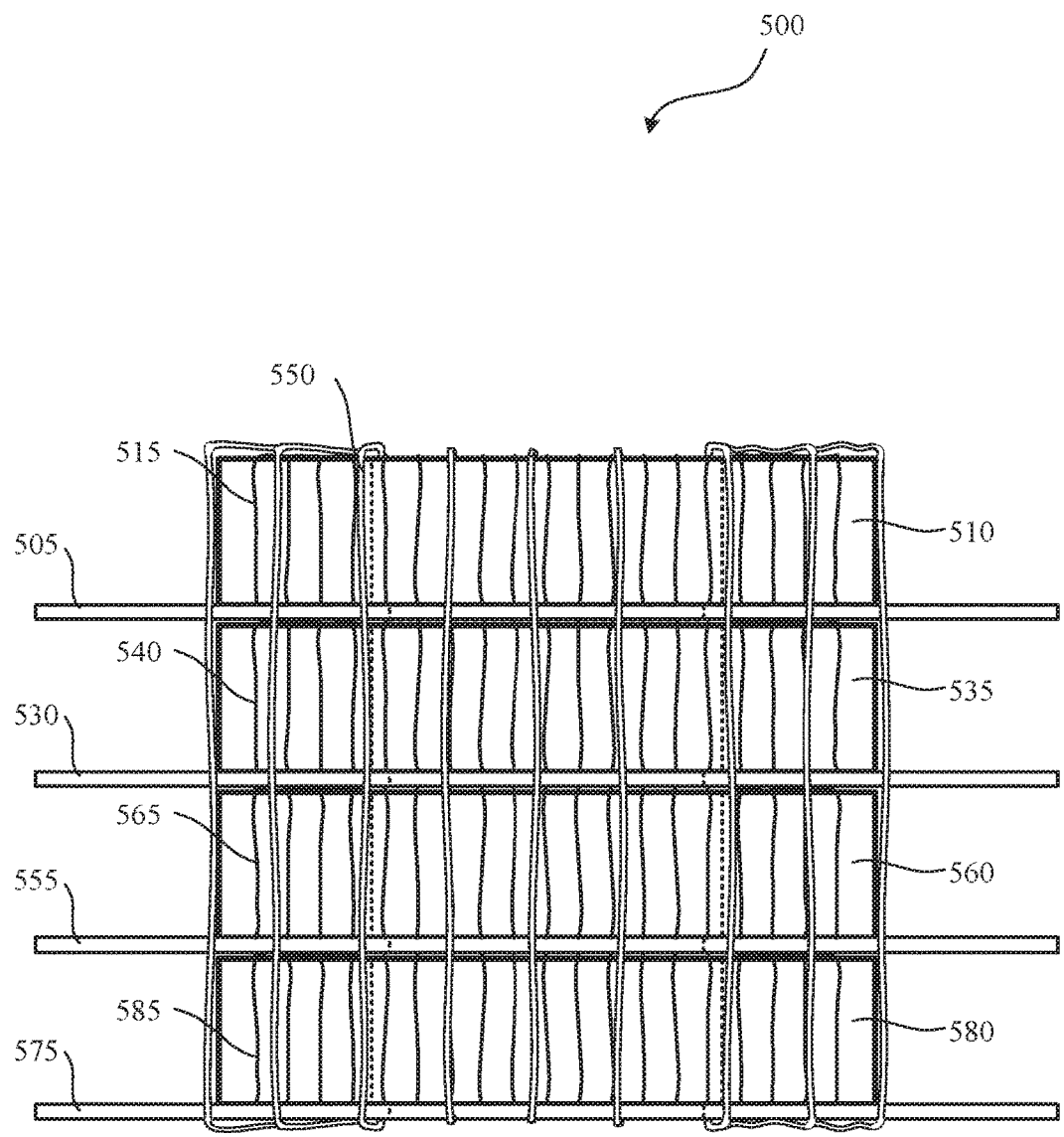
FIG. 5 illustrates a view of a stacked transformer arrangement.

In some embodiments multiple circuit boards with toroid shaped transformer cores may be stacked together and the secondary windings may wrap around the transformer cores of each board as shown in FIG. 5. Such an arrangement, for example, may increase the peak voltage and/or the peak power of a pulse. Such an arrangement may also limit stray inductance and/or stray capacitance.

Figure 4:
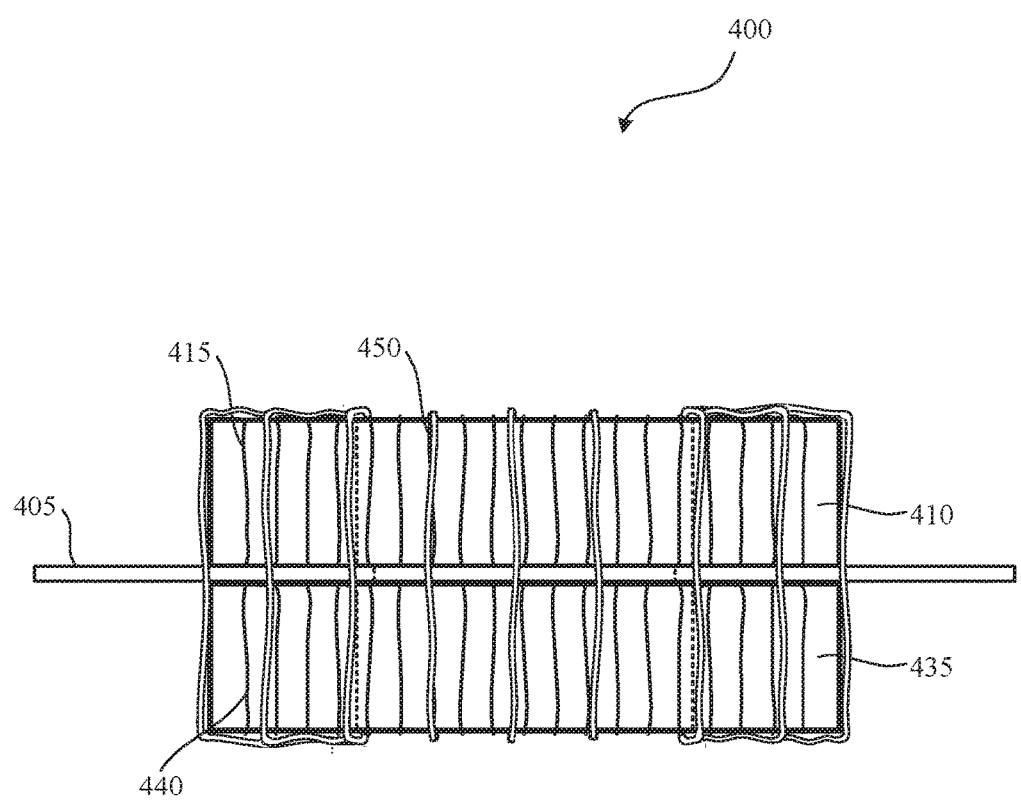
FIG. 4 illustrates a view of a stacked transformer arrangement with two transformers staked on the top and the bottom of a circuit board.

FIG. 4 illustrates a view of a stacked transformer arrangement 400 with two transformers stacked on the top and the bottom of a circuit board 405. The stacked transformer arrangement 400 includes a first transformer core 410 and a first plurality of primary windings 415 (only a single primary winding is labeled with callout 415 in the figure) disposed on the top of the circuit board 405. The stacked transformer arrangement 400 also includes a second transformer core 435 and a second plurality of primary windings 440 (only a single primary winding is labeled with callout 440 in the figure) disposed on the bottom of the circuit board 405. Note that the inner portion (or hole) within each of toroid shaped first transformer core 410 and second transformer core 435 is illustrated with dashed lines. In addition, a hole in the circuit board that is aligned with the hole in the toroid shaped transformer cores is shown with dashed lines on the circuit board.

Each of the first plurality of primary windings 415 may be wound one or more times around the first transformer core 410. For example, each of the first plurality of primary windings 415 may terminate on the top of the circuit board 405 outside the outer perimeter of the first transformer core 410 and on the top of the circuit board 405 within the hole within the toroid shaped first transformer core 410. Alternatively or additionally, each winding of the first plurality of primary windings 415 may be wound one or more times around the first transformer core 410. The first plurality of primary windings 415 may be coupled with one or more switch circuits (e.g., switch circuits 105 shown in FIG. 1), one or more fast capacitors (e.g., fast capacitor 110), and/or other components disposed on the top of the circuit board 405. Alternatively or additionally, the first plurality of primary windings 415 may be coupled with a single switch circuit (e.g., switch circuits 105 shown in FIG. 1) and/or a single fast capacitor (e.g., fast capacitor 110).

Each of the second plurality of primary windings 440 is wound one or more times around the second transformer core 435. For example, each of the second plurality of primary windings 440 terminate on the bottom of the circuit board 405 outside the outer perimeter of the second transformer core 435 and on the bottom of the circuit board 405 within the hole within the toroid shaped second transformer core 435. Alternatively or additionally, each winding of the second plurality of primary windings 440 may be wound one or more times around the second transformer core 435. The second plurality of primary windings 440 may be coupled with a second switch circuit (e.g., switch circuit 105 shown in FIG. 1) and/or other components disposed on the bottom of the circuit board 405.

Each or a plurality of the loops of the secondary windings 450 (only a single loop of the secondary winding is labeled with callout 450 in the figure) are wound around both the first transformer core 410 and the second transformer core 435. For example, each or a plurality of the loops of the secondary windings 450 pass through both holes within each of the toroid shaped first transformer core 410 and the toroid shaped second transformer core 435. In some configurations, each or a plurality of the loops of the secondary windings 450 pass through holes within the circuit board 405.

FIG. 5 illustrates a view of a stacked transformer arrangement 500 with a first circuit board 505 with a first transformer core 510 and a first plurality of primary windings 515 (only a single primary winding is labeled with callout 515 in the figure). The stacked transformer arrangement 500 also includes a second circuit board 530 with a second transformer core 535 and a second plurality of primary windings 540 (only a single primary winding is labeled with callout 540 in the figure). The stacked transformer arrangement 500 also includes a third circuit board 555 with a third transformer core 560 and a third plurality of primary windings 565 (only a single primary winding is labeled with callout 565 in the figure). The stacked transformer arrangement 500 also includes a fourth circuit board 575 with a fourth transformer core 580 and a fourth plurality of primary windings 585 (only a single primary winding is labeled with callout 585 in the figure). Note that the inner portion (or hole) of each of first transformer core 510, second transformer core 535, third transformer core 560, and fourth transformer core 580 is illustrated with dashed lines.

Each of the first plurality of primary windings 515 is wound once or less around the first transformer core 510. For example, each of the first plurality of primary windings 515 terminate on the first circuit board 505 outside the first transformer core 510 and within the hole within the toroid shaped first transformer core 510. Alternatively or additionally, each winding of the first plurality of primary windings 515 may be wound one or more times around the first transformer core 510. The first plurality of primary windings 515 may be coupled with a first switch circuit (e.g., switch circuit 105 shown in FIG. 1) and/or other components disposed on the first circuit board 505.

Each of the second plurality of primary windings 540 is wound once or less around the second transformer core 535. For example, each of the second plurality of primary windings 540 terminate on the second circuit board 530 outside the second transformer core 535 and within the hole within the toroid shaped second transformer core 535. Alternatively or additionally, each winding of the second plurality of primary windings 540 may be wound one or more times around the second transformer core 535. The second plurality of primary windings 540 may be coupled with a second switch circuit (e.g., switch circuit 105 shown in FIG. 1) and/or other components disposed on the second circuit board 530.

Each of the third plurality of primary windings 565 is wound once or less around the third transformer core 560. For example, each of the third plurality of primary windings 565 terminate on the third circuit board 555 outside the third transformer core 560 and within the hole within the toroid shaped third transformer core 560. Alternatively or additionally, each winding of the third plurality of primary windings 565 may be wound one or more times around the third transformer core 560. The third plurality of primary windings 565 may be coupled with a third switch circuit (e.g., switch circuit 105 shown in FIG. 1) and/or other components disposed on the third circuit board 555.

Each of the fourth plurality of primary windings 585 is wound once or less around the fourth transformer core 580. For example, each of the fourth plurality of primary windings 585 terminate on the fourth circuit board 575 outside the fourth transformer core 580 and within the hole within the toroid shaped fourth transformer core 580. Alternatively or additionally, each winding of the fourth plurality of primary windings 585 may be wound one or more times around the fourth transformer core 580. The fourth plurality of primary windings 585 may be coupled with a fourth switch circuit (e.g., switch circuit 105 shown in FIG. 1) and/or other components disposed on the fourth circuit board 575.

Each or a plurality of the loops of the secondary windings 550 (only a single loop of the secondary winding is labeled with callout 550 in the figure) are wound around both the first transformer core 510 and the second transformer core 535. For example, each or a plurality of the loops of the secondary windings 550 pass through both holes within each of the toroid shaped first transformer core 510 and the toroid shaped second transformer core 535. In some configurations, each or a plurality of the loops of the secondary windings 550 pass through holes within the first circuit board 505 and/or holes within the second circuit board 530.

While the stacked transformer arrangement 400 and the stacked transformer arrangement 500 illustrate examples of stacked transformer cores with two and four stacked transformer cores respectively, any number of transformers may be stacked in any combination. For example, two transformers may be stacked with a first circuit board as shown in FIG. 4 into a first stacked arrangement and two additional transformers may be stacked with a second circuit board into a second stacked arrangement. The first stacked arrangement and the second stacked arrangement may then be stacked together to form another stacked arrangement. Various other combinations may also be used.

Figure 6:
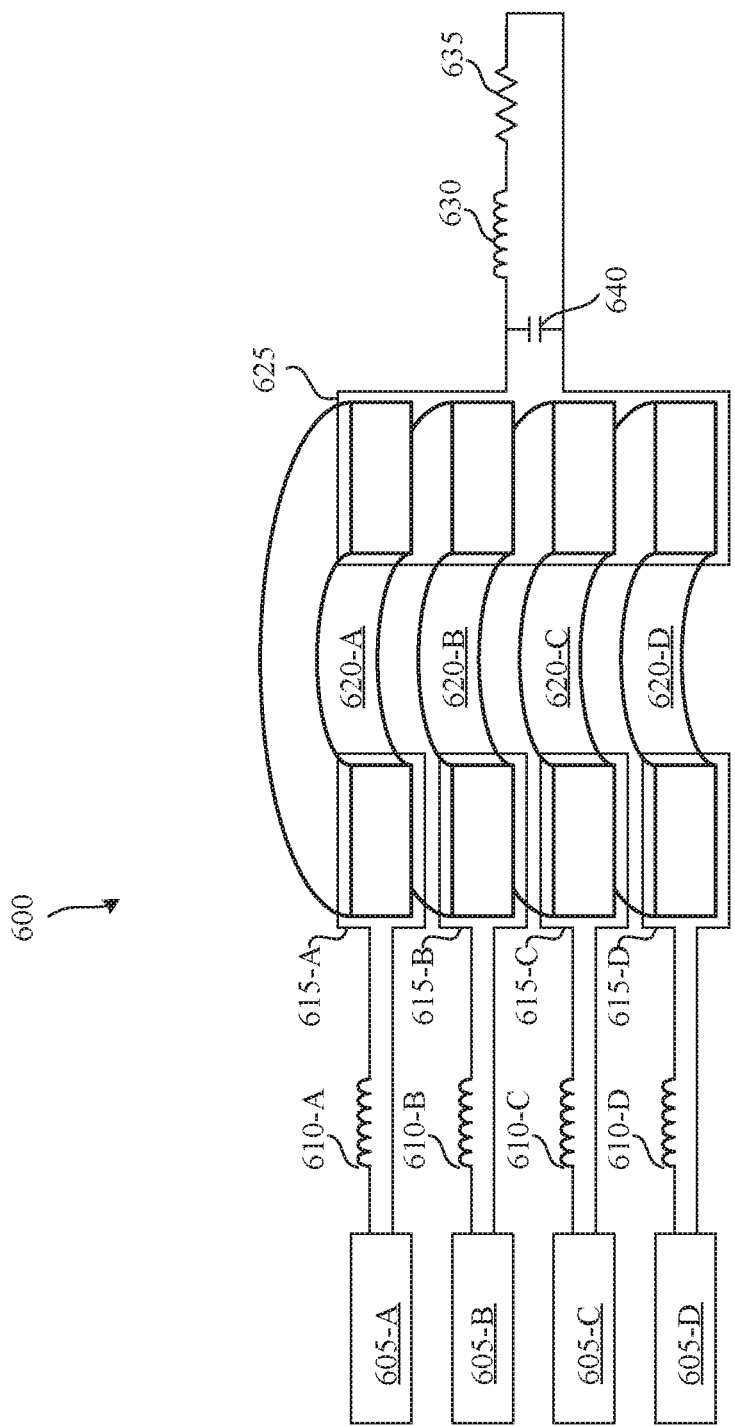
FIG. 6 is a diagram of a multi-transformer core nanosecond pulser according to some embodiments.

FIG. 6 is a diagram of a multi-transformer core nanosecond pulser 600 according to some embodiments. The multi-transformer core nanosecond pulser 600 includes four switch circuits 605-A, 605-B, 605-C and 605-D. In some embodiments, each switch circuit 605, for example, may include one or more switch circuits 105 shown in FIG. 1. In some embodiments, each switch circuit 605, for example, may include all or portions of switch circuit 105 shown in FIG. 1. The switch circuits 605 may be coupled with a primary winding 615 that is wound at least partially around transformer core 620 of a transformer. Stray inductance 610 may be found between and/or as part of the switch circuit 605 and the primary winding 615. In some embodiments, one or more windings of the primary windings 615 may be coupled with one or more switches of the switch circuit 605.

The secondary winding 625 is wound around four transformer cores 620-A, 620-B, 620-C and 620-D of the multi-transformer core nanosecond pulser 600. The secondary winding 625 may include secondary stray inductance 630 and/or the secondary stray capacitance 640. In some embodiments, the secondary stray capacitance 640 may be less than 1 nf, 100 pF, 10 pF, 1 pF, etc. In some embodiments, the secondary stray inductance 630 may be less than 100 nH, 10 nH, 1 nH, etc. In addition, the multi-transformer core nanosecond pulser 600 may be used to drive the load 635. While the stray capacitance and/or stray inductance may be located throughout the transformer the values of the stray capacitance and/or stray inductance may be measured across the secondary winding.

While four switch circuits 605 are shown in multi-transformer core nanosecond pulser 600 any number of switch circuits 605 may be used in a multi-transformer core nanosecond pulser 600.

Figure 7:
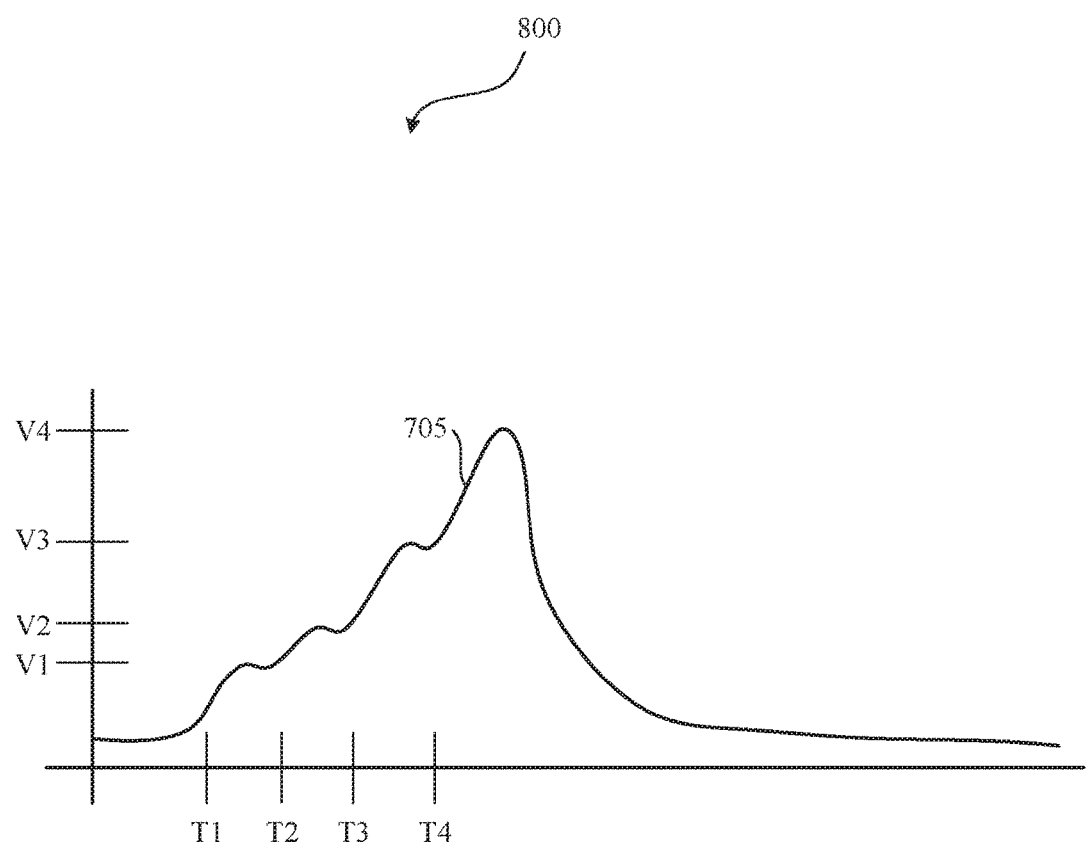
FIG. 7 is a graph of an output signal of a sequential multi-transformer core switching arrangement according to some embodiments.

In some embodiments, the switches in each of the switch circuits 605 may be switched at different times and/or in different sequences. For example, each switch of a subset of the switches or all of the switches may be switched on after a predetermined time period until each switch of a subset of the switches or all of the switches are turned on. An example output signal 705 of a sequential multi-transformer core switching arrangement such as this is shown in FIG. 7. As shown, the output signal 705 increases in a stepwise manner as each switch of the subset of switches is turned on. In this example, a first switch is turned on at time T1 and the output signal 705 rises to voltage V1. A second switch is turned on at time T2 and the output signal 705 rises to voltage V2. A third switch is turned on at time T3 and the output signal 705 rises to voltage V3. A fourth switch is turned on at time T4 and the output signal 705 rises to voltage V4. In some embodiments, the voltages V1, V2, V3, and/or V4 may be greater than 0.1, 0.5, 1.0, 5, 10, 50, 100, 500, etc. kilovolts. In some embodiments, the time periods T1, T2, T3, and/or T4 may be less than 200, 100, 50, 25, 10, etc. nanoseconds. In some embodiments, the rise time of each voltage increase can be less than 100, 10, 1, etc. nanoseconds.

Figure 8:
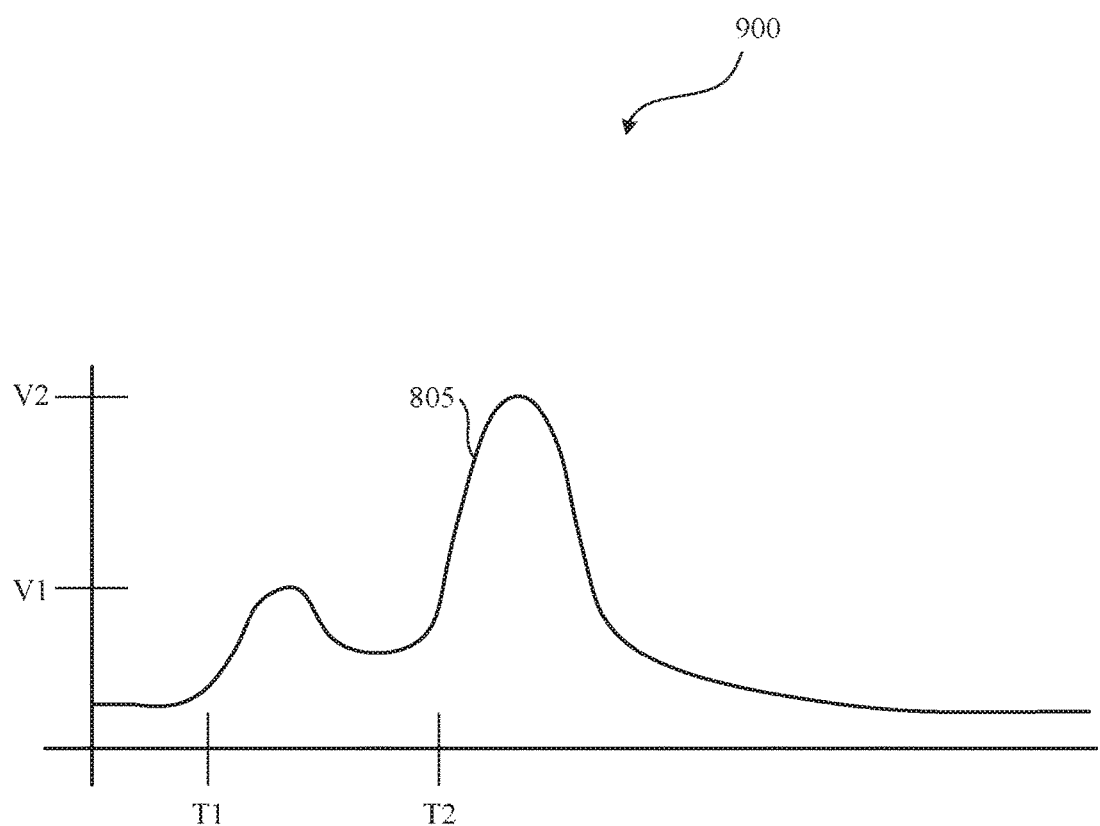
FIG. 8 is a graph of an output signal of a sequential multi-transformer core switching arrangement according to some embodiments.

As another example, a subset of switches may be switched on at one period of time and a second subset of switches may be switched on at a different period of time. An example output signal 805 of a sequential multi-transformer core switching arrangement such as this is shown in FIG. 8. In this example, switches in two of the switch circuits 605 are turned on at time T1 and the output signal 805 rises to a voltage V1. Later, at time T2, another two switches of the switch circuits 605 are turned on at time T2 and the output signal 805 rises to a voltage V2. In some embodiments, the voltages V1 and/or V2 may be greater than 0.1, 0.5, 1.0, 5, 10, 50, 100, 500, etc. kilovolts. In some embodiments, the time periods T1 and/or T2 may be less than 200, 100, 50, 25, 10, etc. nanoseconds. In some embodiments, the rise time of each voltage increase can be less than 100, 10, 1, etc. nanoseconds.

Any combination of switching among the switches in switch circuits 605 may be turned on and/or turned off in any combination and/or sequence to produce various output signals shapes or waveforms. In some embodiments, a controller, processor, FPGA, etc. may be used to control the timing, duration, order, sequence, etc. of switching switches on and off to produce waveforms of various sizes, shapes and/or configurations.

FIG. 9 illustrates a cutaway side view of a transformer 910 with a single primary winding 925 and a single secondary winding 920 wrapped around a transformer core 910 according to some embodiments. While only a single primary winding 925 and a single secondary winding 920 are shown, any number of windings may be used. This image only shows a single primary winding 925 and a single secondary winding 920 in order to show how the windings are uniquely wound around the transformer core 910.

In some embodiments, the primary windings may be disposed close to the core to reduce stray inductance. In some embodiments, the secondary windings may be spaced some distance away from the core to reduce stray capacitance.

As shown the primary winding 925 terminates at pad 940 on the outer perimeter of the transformer core 910 and at pad 941 within the central hole of the toroid shaped transformer core 910. In some embodiments, the pad 941 may be coupled with a conductive circuit board trace on an internal layer of the circuit board 905. The pad 940 and the pad 941 electrically couple the primary winding with the primary circuitry including, for example, a switch circuit (e.g., switch circuit 105) and/or other components.

As shown, the secondary winding 920 is wrapped around the transformer core 910 by passing through hole 930 in the circuit board 905 located at the perimeter of the toroid shaped transformer core 910, the internal hole of the toroid shaped transformer core 910, and the hole 911 in the circuit board 905. Successive windings of the secondary winding 920 may pass through hole 930 or another hole 931 in the circuit board. Additionally, successive windings of the secondary winding 920 may pass through hole 911 in the circuit board 905. The secondary winding 920 may be coupled with a secondary circuitry such as, for example, a compression circuit, output components, and/or a load. In some embodiments, a single secondary winding 920 may be wrapped around the transformer core 910 a plurality of times passing through a plurality of holes located on the perimeter of the transformer core 910 and the hole 911.

Figure 10:
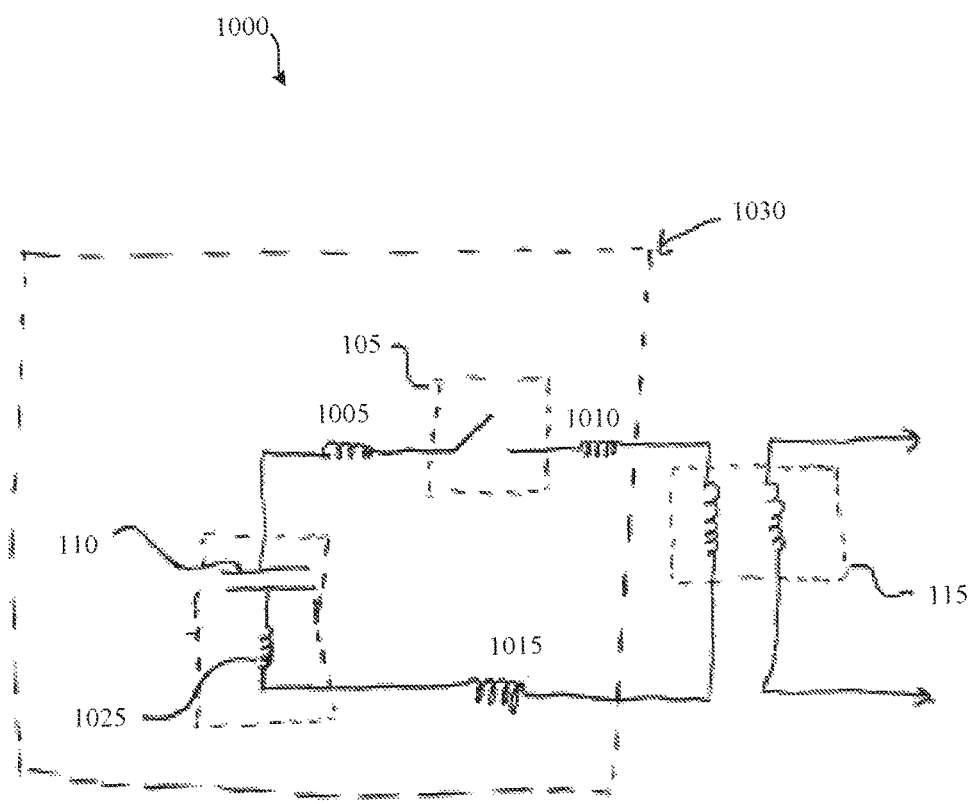
FIG. 10 illustrates an example circuit diagram of a nanosecond pulser according to some embodiments.

FIG. 10 illustrates an example circuit diagram of a nanosecond pulser 1000 according to some embodiments. The nanosecond pulser 1000 may include one or more switch circuits 105 that may include a switch, a snubber resistor, a snubber capacitor, a snubber diode, or some combination thereof as shown in nanosecond pulser 1000 illustrated in FIG. 1. The nanosecond pulser 1000 includes a primary stage circuit 1030 that includes at least the switch circuit 105 and the fast capacitor 110 and/or any other components coupled with the primary windings of a transformer of the transformer circuit 115. In some embodiments, the snubber capacitor and the snubber diode may be arranged in series with each other and together in parallel with the switch. The snubber resistor, for example, may be arranged in parallel with the snubber diode.

The switch of the switch circuit 105 may include any solid state switching device that can switch high voltages such as, for example, a solid state switch, an IGBT, an FET, a MOSFET, an SiC junction transistor, or a similar device. The switch may include a collector and an emitter. Various other components may be included with the switch circuit 105 in conjunction with the switch. A plurality of switch circuits 105 in parallel, in series, or some combination thereof may be coupled with the transformer circuit 115.

The switch circuit 105 may be coupled with or may include a fast capacitor 110, which may be used for energy storage. In some embodiments, more than one switch circuit 105 may be coupled with a fast capacitor 110. In some embodiments, the fast capacitor may be an energy storage capacitor. The fast capacitor 110 may have a capacitance value of about 1 µF, about 5 µF, between about 1 µF and about 5 µF, between about 100 nF and about 1,000 nF etc.

The fast capacitor 110 may have a stray inductance which is illustrated as stray inductor 1020. This stray inductance may be the stray inductance of the fast capacitor 110 as well as the stray inductance associated with the fast capacitor and/or any connection to other components such as, for example, connections with the switch circuit 105 and/or the transformer circuit 115. In some embodiments, the stray inductor 1020 may have an inductance of less than 1 nH, 5 nH, 20 nH, 50 nH, 100 nH, etc.

During switching of the switch, the energy in the fast capacitor 110 may be discharged to the primary winding of the transformer circuit 115. Moreover, in some embodiments, the energy within the fast capacitor 110 may not be substantially drained during each switch cycle, which may allow for a higher pulse repetition frequency. For example, in one switch cycle 5%-50% of the energy stored within the fast capacitor 110 may be drained. As another example, in one switch cycle 10%-40% of the energy stored within the fast capacitor 110 may be drained. As yet another example, in one switch cycle 15%-25% of the energy stored within the fast capacitor 110 may be drained.

The switch circuit 105 and the fast capacitor 110 may be coupled with a transformer circuit 115. The transformer circuit 115, for example, may include a transformer, capacitors, inductors, resistors, other devices, or some combination thereof. The transformer may include a toroid shaped transformer core with a plurality of primary windings and a plurality of secondary windings wound around the transformer core. In some embodiments, there may be more primary windings than secondary windings.

The transformer circuit 115 may include stray capacitance and/or stray inductance. Stray capacitor 185 represents the transformer primary to secondary stray capacitance. Stray capacitor 190 represents the transformer secondary stray capacitance. Inductor 155 represents the primary stray inductance of the transformer, and inductor 160 represents the secondary stray inductance of the transformer.

Stray inductor 1015 represents the transformer circuit 115 and/or the transformer stray inductance. This stray inductance may include the transformer primary to secondary stray inductance and/or the stray inductance associated with the transformer circuit 115 and/or any connection to other components such as, for example, connections with the switch circuit 105 and/or the fast capacitor 110. In some embodiments, the stray inductor 1015 may have an inductance of less than 1 nH, 5 nH, 20 nH, 50 nH, 100 nH, etc. between about 1 nH and 1,000 nH, less than about 100 nH, or less than about 500 nH, etc.

In some embodiments, the transformer 116 may include a toroid shaped transformer core comprised of air, iron, ferrite, soft ferrite, MnZn, NiZn, hard ferrite, powder, nickel-iron alloys, amorphous metal, glassy metal, or some combination thereof.

In some embodiments, the transformer primary to secondary stray capacitance and/or the transformer secondary stray capacitance may be below about 1 pF, below about 100 pF, about 10 pF, about 20 pF, etc. In some embodiments, the sum of the secondary stray capacitance and the primary stray capacitance may be less than about 50 pF, 75 pF, 100 pF, 125 pF, 135 pF, etc.

In some embodiments, a nanosecond pulser may be designed with low stray capacitance. For example, the sum of all stray capacitance within the nanosecond pulser may be below 500 pF. This may include transformer circuit stray capacitance, switch circuit stray capacitance, other stray capacitance, or some combination thereof.

The primary windings of the transformer 116 can include a plurality of single windings. For example, each of the primary windings may include a single wire that wraps around at least a substantial portion of the toroid shaped transformer core and terminate on either side of the transformer core. As another example, one end of the primary windings may terminate at the collector (e.g., collector 107 shown in FIG. 1) of the switch and another end of the primary windings may terminate at the fast capacitor 110. Any number of primary windings in series or in parallel may be used depending on the application. For example, about 10, 20, 40, 50, 100, 116, 200, 250, 300, etc. or more windings may be used for the primary winding.

In some embodiments, a single primary winding may be coupled with a single switch circuit 105. In some embodiments, a plurality of switch circuits may be included and each of the plurality of switch circuits may be coupled with one of a plurality of primary windings. The plurality of windings may be arranged in parallel about the transformer core. In some embodiments, this arrangement may be used to reduce stray inductance in the nanosecond pulser 1000.

The nanosecond pulser 1000 may have low stray inductance between components. For example, stray inductor 1005 illustrates the stray inductance associated with the connection between the generalized fast capacitor 110 and the generalized switch circuit 105. Stray inductor 1005 may include at least in part the stray inductance in the fast capacitor 110, the switch circuit 105, the switch within the switch circuit 105, the connections between these components, and/or the circuit board. In some embodiments, the stray inductor 1005 may have an inductance of less than 1 nH, 5 nH, 20 nH, 50 nH, 100 nH, etc. between about 1 nH and 1,000 nH, less than about 100 nH, or less than about 500 nH, etc.

As another example, stray inductor 1010 illustrates the stray inductance associated with the connection between the generalized switch circuit 105 and the generalized transformer circuit 116. Stray inductor 1010 may include at least in part the stray inductance in the switch circuit 105, the switch within the switch circuit 105, the stray inductance in the transformer circuit 115, the transformer within the transformer circuit 115, the primary winding of the transformer within the transformer circuit 116, the connections between these components, and/or the circuit board. In some embodiments, the stray inductor 1010 may have an inductance of less than 1 nH, 5 nH, 20 nH, 50 nH, 100 nH, etc. between about 1 nH and 1,000 nH, less than about 100 nH, or less than about 500 nH, etc.

As another example, stray inductor 1015 illustrates the stray inductance associated with the connection between the fast capacitor 110 and the generalized transformer circuit 116. Stray inductor 1010 may include at least in part the stray inductance in the fast capacitor 110, the stray inductance in the transformer circuit 115, the transformer within the transformer circuit 115, the primary winding of the transformer within the transformer circuit 116, the connections between these components, and/or the circuit board. In some embodiments, the stray inductor 1015 may have an inductance of less than 1 nH, 5 nH, 20 nH, 50 nH, 100 nH, etc. between about 1 nH and 1,000 nH, less than about 100 nH, or less than about 500 nH, etc.

The term "generalized" describes the combination of an idealized element (for example, the transformer circuit 115 and/or the transformer within the transformer circuit 115) along with the associated non ideal elements (for example, the stray inductance 1005, 1110, 1115 and 1020, and/or any stray capacitance).

The stray inductances shown in FIG. 10 and described above may be included in nanosecond pulser 100 of FIG. 1.

The secondary winding of the transformer within the transformer circuit 115 (for example, transformer 116 shown in FIG. 1) may include a single wire wrapped around the transformer core any number of times. For example, the secondary winding may include 5, 10, 20, 30, 40, 50, 100, etc. windings. In some embodiments, the secondary winding may wrap around the transformer core and through portions of the circuit board (e.g., as shown in FIG. 9). For example, the transformer core may be positioned on the circuit board with a plurality of slots in the circuit board arranged axially around the outside of the transformer core and an interior slot in the circuit board positioned in the center of the toroid shaped transformer core. The secondary winding may wrap around the toroid shaped transformer core and wrap through slots and the interior slot. The secondary winding may include high voltage wire.

Various embodiments of the invention are disclosed and described. The invention may extend to any combination of all or some of each of the disclosed embodiments without limitation.

The term "substantially" means within 5% or 10% of the value referred to or within manufacturing tolerances.

The system or systems discussed herein are not limited to any particular hardware architecture or configuration.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A nanosecond pulser comprising:
   a circuit board;
   one or more switch circuits including one or more solid state switches;
   a transformer comprising:
      a first transformer core;
      a second transformer core;
      a first primary winding wound at least partially around a portion of the first transformer core, each of the one or more switch circuits are coupled with at least a portion of the first primary winding; and
      a secondary winding wound at least partially around a portion of the first transformer core and a portion of the second transformer core; and
   an output electrically coupled with the secondary winding that outputs electrical pulses having a peak voltage greater than about 1 kilovolt and a rise time of less than 150 nanoseconds;
   wherein the first transformer core comprises a first hole having a central axis;
   wherein the second transformer core comprises a second hole having a central axis;
   wherein the circuit board comprises a circuit board hole having a central axis that is aligned with the central axis of the first hole of the first transformer and the central axis of the second hole of the second transformer; and
   wherein the secondary winding passes through the first hole in the first transformer core, the second hole in the second transformer core, and the circuit board hole in the circuit board.

2. The nanosecond pulser according to claim 1, further comprising a pulse compression circuit disposed between the secondary winding and the output.

3. The nanosecond pulser according to claim 2, wherein the pulse compression circuit comprises at least a saturable inductor arranged in series with the output and a secondary capacitor arranged in parallel with the output.

4. The nanosecond pulser according to claim 3, wherein the saturable inductor comprises an inductance less than about 100 µH and the secondary capacitor comprises a capacitance less than about 100 nF.

5. The nanosecond pulser according to claim 3, wherein the saturable inductor is arranged in parallel with the output.

6. The nanosecond pulser according to claim 1, wherein the first primary winding comprises a plurality of primary windings wound at least partially around a portion of the first transformer core, and wherein each of the one or more switch circuits are coupled with a subset of the primary windings.

7. The nanosecond pulser according to claim 1, further comprising a second one or more switch circuits,
   wherein the transformer further comprises a second transformer core and a second primary winding wound at least partially around a portion of the second transformer core,
   wherein one or more of the second one or more switch circuits are coupled with the second primary windings, and
   wherein the second primary winding is wound at least partially around a portion of the first transformer core and the second transformer core.

8. The nanosecond pulser according to claim 1, wherein the secondary winding passes through the first hole in the first transformer core and the first primary winding passes through the first hole in the first transformer core.

9. The nanosecond pulser according to claim 1,
   wherein the circuit board comprises a plurality of secondary holes;
   wherein the first primary winding terminates on the top surface of the circuit board; and
   wherein the secondary winding passes through at least two of the plurality of secondary holes.

10. A nanosecond pulser comprising:
   a first circuit board;
   a first switch circuit;
   a first transformer core;
   a first primary winding electrically coupled with the first switch circuit and wrapped at least partially around the first transformer core;
   a second switch circuit;
   a second transformer core disposed adjacent to the first transformer core;
   a second primary winding electrically coupled with the second switch circuit and wrapped at least partially around the second transformer core;
   a secondary winding wrapped around the first transformer core and the second transformer core; and
   an output coupled with the secondary winding;
   wherein the first transformer core comprises a first hole;
   wherein the second transformer core comprises a second hole;
   wherein the first circuit board comprises a first circuit board hole having a central axis that is aligned with a central axis of the first hole of the first transformer and a central axis of the second hole of the second transformer; and
   wherein the secondary winding passes through the first hole in the first transformer core, the second hole in the second transformer core, and the first circuit board hole in the first circuit board.

11. The nanosecond pulser according to claim 10, wherein the output provides electrical pulses having a peak voltage greater than about 1 kilovolt and a rise time of less than 150 nanoseconds.

12. The nanosecond pulser according to claim 10, wherein the first circuit board is disposed between the first transformer core and the second transformer core.

13. The nanosecond pulser according to claim 12,
   wherein the first transformer core comprises a perimeter;
   wherein the first transformer core is disposed on a top surface of the first circuit board; and wherein the first primary winding comprises a first plurality of windings that are electrically coupled with the first circuit board near the perimeter of the first transformer core and near the first hole of the first transformer core.

14. The nanosecond pulser according to claim 13,
wherein the second transformer core comprises a perimeter;
wherein the second transformer core is disposed on a bottom surface of the first circuit board; and
wherein the second primary winding comprises a second plurality of windings that are electrically coupled with the circuit board near the perimeter of the second transformer core and near the second hole of the second transformer core.

15. The nanosecond pulser according to claim 10, further comprising a second circuit board comprising a second circuit board hole; wherein the secondary winding passes through the first hole in the first transformer core, the second hole in the second transformer core, the first circuit board hole in the first circuit board and the second circuit board hole in the second circuit board.

16. The nanosecond pulser according to claim 10, further comprising a pulse compression circuit disposed between the secondary winding and the output.

17. The nanosecond pulser according to claim 10, wherein the secondary winding comprises a single conductor wrapped multiple times around the first transformer core and the second transformer core.

18. A nanosecond pulser comprising:
a circuit board;
one or more switch circuits including one or more solid state switches;
a fast capacitor disposed in series with the switch circuit;
a transformer comprising:
  a first transformer core;
  a second transformer core;
  a first primary winding wound at least partially around a portion of the first transformer core, each of the one or more switch circuits are coupled with at least a portion of the first primary winding; and
  a secondary winding wound at least partially around a portion of the first transformer core and a portion of the second transformer core; and
an output electrically coupled with the secondary winding that outputs electrical pulses having a peak voltage greater than about 1 kilovolt and a rise time of less than about 150 nanoseconds;
wherein the first transformer core comprises a first hole;
wherein the second transformer core comprises a second hole;
wherein the circuit board comprises a circuit board hole that is aligned with the first hole of the first transformer and the second hole of the second transformer; and
wherein the secondary winding passes through the first hole in the first transformer core, the second hole in the second transformer core, and the circuit board hole in the circuit board.

19. The nanosecond pulser according to claim 18, wherein any stray inductance associated with the connection between the one or more switch circuits and the fast capacitor is less than 50 nH.

20. The nanosecond pulser according to claim 18, wherein any stray inductance associated with the connection between the fast capacitor and the transformer is less than 50 nH.

21. The nanosecond pulser according to claim 18, wherein any stray inductance associated with the connection between the transformer and the one or more switch circuits is less than 50 nH.

* * * * *